United States Patent
Choi et al.

(10) Patent No.: US 7,230,475 B2
(45) Date of Patent: Jun. 12, 2007

(54) SEMICONDUCTOR DEVICES INCLUDING AN EXTERNAL POWER VOLTAGE CONTROL FUNCTION AND METHODS OF OPERATING THE SAME

(75) Inventors: Jong-Hyun Choi, Gyeonggi-do (KR); Mi-Jo Kim, Gyeonggi-do (KR); Kwang-Sook Noh, Gyeonggi-do (KR); Beob-Rae Cho, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/005,523

(22) Filed: Dec. 6, 2004

(65) Prior Publication Data

US 2005/0122820 A1 Jun. 9, 2005

(30) Foreign Application Priority Data

Dec. 5, 2003 (KR) .................. 10-2003-0087877

(51) Int. Cl.
*G05F 1/10* (2006.01)

(52) U.S. Cl. .................. 327/544; 327/554

(58) Field of Classification Search .......... 327/333, 327/544, 554, 534–543; 326/63, 68, 80–83; 365/226

See application file for complete search history.

(56) References Cited

U.S. PATENT DOCUMENTS

| 6,545,531 B1 | 4/2003 | Hur ................ 327/544 |
| 6,560,158 B2 | 5/2003 | Choi et al. ........... 365/226 |
| 6,744,687 B2* | 6/2004 | Koo et al. ........... 365/226 |
| 6,923,377 B2* | 8/2005 | Postman et al. ...... 235/487 |
| 2004/0232944 A1* | 11/2004 | Bu et al. ............ 326/68 |

* cited by examiner

*Primary Examiner*—Linh My Nguyen
(74) *Attorney, Agent, or Firm*—Myers Bigel Sibley & Sajovec, PA

(57) ABSTRACT

A semiconductor device includes a memory and a power voltage interrupter configured to interrupt an external power voltage applied to circuitry of the semiconductor device responsive to a Deep Power Down (DPD) command signal generated in a DPD mode of the memory. A power voltage shifter is configured to shift a power voltage in the circuitry to a specific level responsive to the DPD command signal.

12 Claims, 9 Drawing Sheets

SEMICONDUCTOR DEVICES INCLUDING AN EXTERNAL POWER VOLTAGE CONTROL FUNCTION AND METHODS OF OPERATING THE SAME

RELATED APPLICATION

This application claims the benefit of and priority to Korean Patent Application No. 2003-87877, filed Dec. 5, 2003, the disclosure of which is hereby incorporated herein by reference.

FIELD OF THE INVENTION

The present invention relates generally to integrated circuit devices and methods of operating the same and, more particularly, to double data rate (DDR) integrated circuit memory devices and methods of operating the same.

BACKGROUND OF THE INVENTION

Due to demand for high integration and high capacity semiconductor devices, the design rules have been consistently reduced so as to integrate more semiconductor devices in a semiconductor chip. The power consumption of the semiconductor devices has also increased with the recent tendency for high integration and high capacity of semiconductor devices, so there have been attempts made at reducing power consumption. For example, a DRAM not in the active mode turns off the internal power voltage used in the circuitry and enters the deep power down (DPD) mode to reduce power consumption. In entering/exiting the DPD mode, however, the circuitry is not biased, but may be erroneously triggered because circuit elements may float to unspecified voltage levels.

A conventional technique for preventing the erroneous trigger of circuitry in entering/exiting the DPD mode is disclosed in U.S. Pat. No. 6,560,158. FIG. 1 is a block diagram of an apparatus for controlling an interval voltage in the DPD mode as disclosed in U.S. Pat. No. 6,560,158. Referring to FIG. 1, the DPD voltage control apparatus includes input buffers 110a, 110b and 110c for signaling a DPD entering/exiting signal and providing the signal to a DPD detector and controller 130; the DPD detector and controller 130 for detecting a DPD condition and generating a DPD signal to turn off internal power voltage generators 150a, 150b and 150c in entering the DPD mode and turn on the internal power voltage generators 150a, 150b and 150c in exiting the DPD mode; bias circuitry 160 for biasing a plurality of nodes; an auxiliary input buffer 120 for separately buffering the DPD entering/exiting signal and providing the signal to an automatic pulse generator 170; and the automatic pulse generator 170 for detecting the DPD exiting signal to generate a voltage pulse. This conventional technique reduces the likelihood that the internal circuitry is erroneously triggered by unspecified voltage levels when the internal power voltage generators are turned on/off.

However, the circuitry to which an external power voltage is applied, such as a level shifter for shifting an internal power voltage level to the external power voltage level, is not biased but is floated to a partial voltage level. Particularly, the output of an output circuit is required to be sustained at a high-impedance state in the DPD mode. But the power voltage level of the level shifter is floated to form a current path at the output of the output circuit or to generate output data, which causes power consumption. In circuitry, such as the level shifter to which the external power voltage is applied, the floated power voltage and the external power voltage may cause leakage current and, hence, power consumption. Moreover, unspecified voltage levels may erroneously trigger latches or equipment sensitive to other voltage levels when the internal power voltage generators are turned on/off.

SUMMARY OF THE INVENTION

According to some embodiments of the present invention, a semiconductor device includes a memory and a power voltage interrupter configured to interrupt an external power voltage applied to circuitry of the semiconductor device responsive to a Deep Power Down (DPD) command signal generated in a DPD mode of the memory. A power voltage shifter is configured to shift a power voltage in the circuitry to a specific level responsive to the DPD command signal.

In other embodiments of the present invention, the power voltage interrupter comprises at least one MOS transistor configured to perform a switching operation to interrupt the external power voltage applied to the circuitry responsive to the DPD command signal.

In still other embodiments of the present invention, the power voltage shifter comprises at least one MOS transistor configured to perform a switching operation to shift the power voltage in the circuitry to the specific level responsive to the DPD command signal.

In still other embodiments of the present invention, the specific level includes a ground voltage level.

In still other embodiments of the present invention, the memory comprises a DRAM.

In further embodiments of the present invention, a semiconductor device includes a memory and a level shifter configured to shift an internal power voltage level to an external power voltage level. An external power voltage controller is configured to interrupt an external power voltage applied to the level shifter responsive to a Deep Power Down (DPD) command signal generated in a DPD mode of the memory, and to shift an output of the level shifter to a specific level.

In still further embodiments of the present invention, the level shifter is responsive to the external power voltage.

In still further embodiments of the present invention, the external power voltage controller comprises at least one MOS transistor configured to perform a switch operation to interrupt the external power voltage applied to the level shifter responsive to the DPD command signal and at least one MOS transistor configured to perform a switching operation to shift the output of the level shifter to the specific level.

In still further embodiments of the present invention, the specific level includes a ground voltage level.

In other embodiments of the present invention, a semiconductor device includes a memory and a level shifter that comprises first and second level shifters that are configured to shift an internal power voltage level to an external power voltage level. An external power voltage controller comprising a first external power voltage controller is configured to interrupt an external power voltage applied to the first level shifter responsive to a Deep Power Down (DPD) command signal generated in a DPD mode of a memory and to shift an output of the first level shifter to a first level, and a second external power voltage controller configured to interrupt a connection to a ground terminal connected to the second level shifter responsive to the DPD command signal and to shift an output of the second level shifter to a second level. An inverter configured to invert the shifted outputs of the first and second level shifters. A driver for outputting high-impedance data is responsive to the inverted shifted output signals of the first and second level shifters.

In still other embodiments of the present invention, the first and second level shifters are responsive to the external power voltage.

In still other embodiments of the present invention, the first external power voltage controller comprises at least one MOS transistor configured to perform a switching operation to interrupt the external power voltage applied to the first level shifter responsive to the DPD command signal and at least one MOS transistor configured to perform a switching operation to shift the output of the first level shifter to the first level.

In still other embodiments of the present invention, the second external power voltage controller comprises at least one MOS transistor configured to perform a switching operation to interrupt a connection to the ground terminal connected to the second level shifter responsive to the DPD command signal and at least one MOS transistor configured to perform a switching operation to shift the output of the second level shifter to the second level.

In still other embodiments of the present invention, the first level comprises a ground voltage level.

In still other embodiments of the present invention, the second level comprises an external power voltage level.

In still other embodiments of the present invention, the inverter comprises a first inverter configured to invert the shifted output of the first level shifter and a second inverter configured to invert the shifted output of the second level shifter.

In still other embodiments of the present invention, the driver comprises one pull-up transistor and one pull-down transistor.

In still other embodiments of the present invention, the pull-up transistor is responsive to the shifted output of the first level shifter, the pull-down transistor being responsive to the shifted output of the second level shifter.

In further embodiments of the present invention, a semiconductor device comprises a memory and an external power voltage controller configured to interrupt an external power voltage connected to circuitry of the semiconductor device responsive to a Deep Power Down (DPD) command signal generated in a DPD mode of the memory, and to interrupt a connection to a ground terminal connected to the circuitry.

In still further embodiments of the present invention, the external power voltage controller comprises at least one MOS transistor configured to perform a switching operation to interrupt the external power voltage applied to the circuitry responsive to the DPD command signal and at least one MOS transistor configured to perform a switching operation to interrupt a connection to the ground terminal connected to the circuitry responsive to the DPD command signal.

Although described above primarily with respect to embodiments of semiconductor devices, it will be understood that the present invention is not limited to such embodiments, but may also be embodied as methods of operating semiconductor devices.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
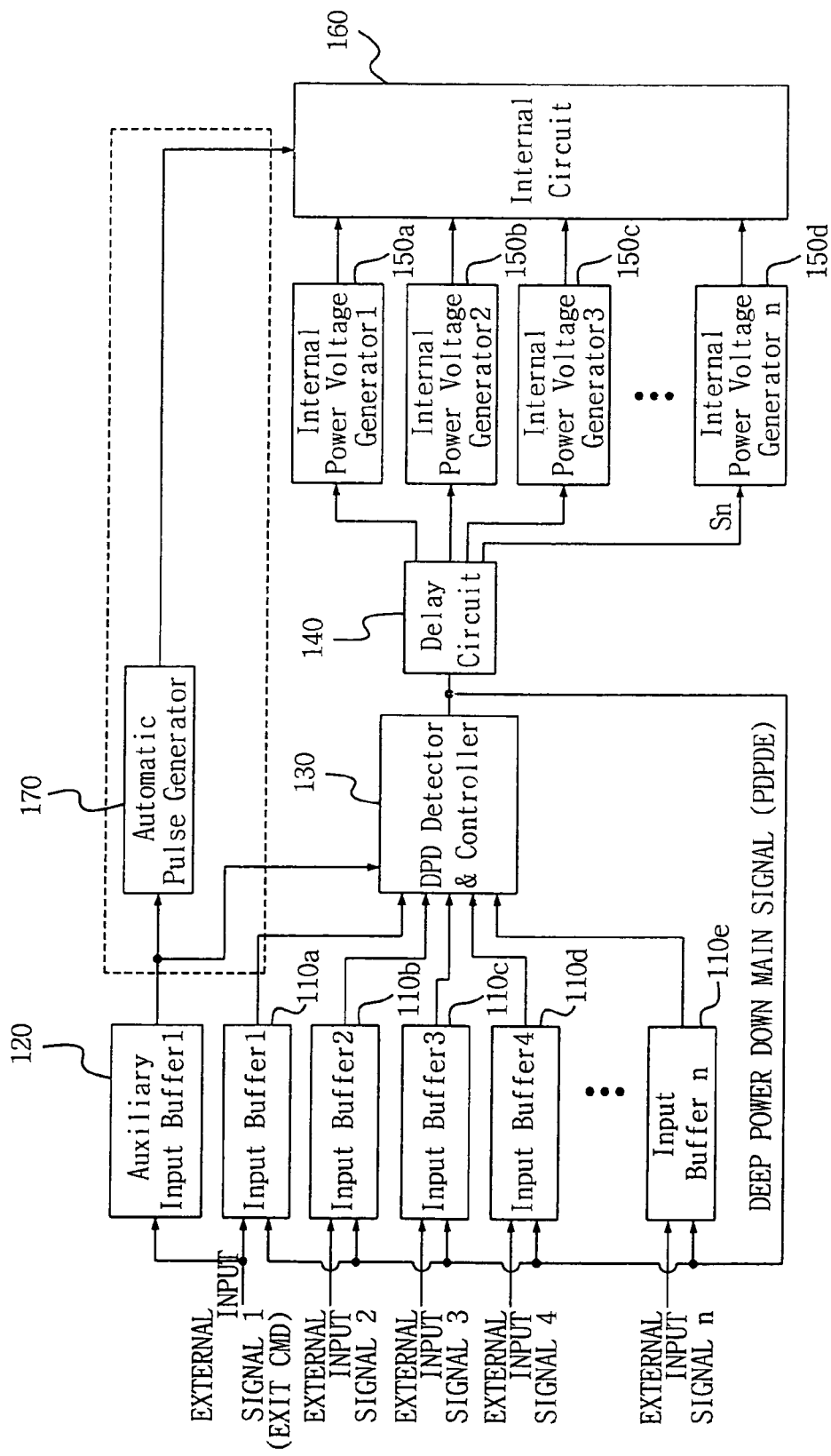
FIG. 1 is a block diagram of a conventional apparatus for controlling an interval voltage in a Deep Power Down (DPD) mode.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Like numbers refer to like elements throughout the description.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top" may be used herein to describe one element's relationship to other elements as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower" can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from an implanted to a non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
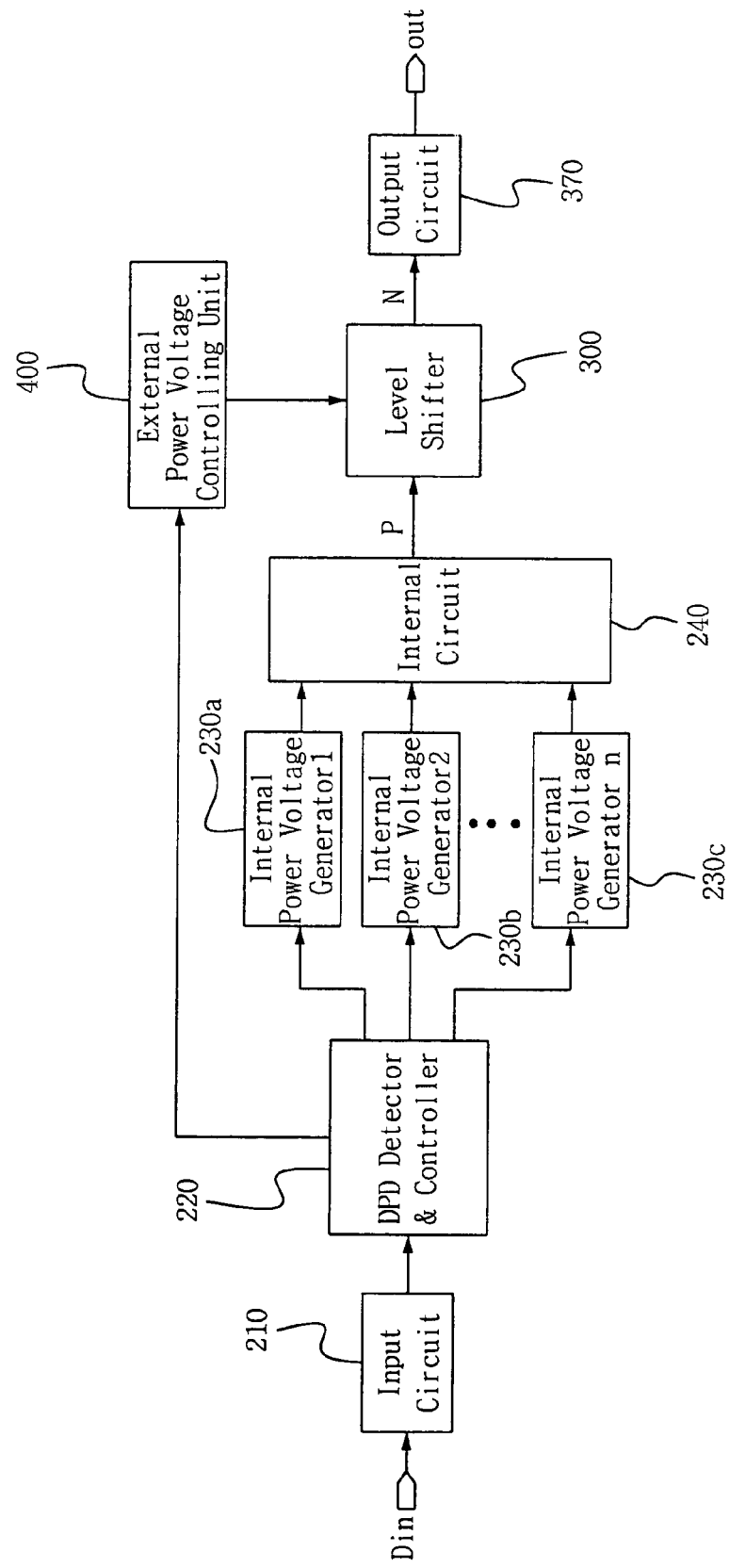
FIG. 2 is a block diagram that illustrates a semiconductor device having an external power voltage control function and operations thereof in accordance with some embodiments of the present invention.

FIG. 2 is a block diagram that illustrates a semiconductor device having an external power voltage control function and operations thereof according to some embodiments of the present invention. Referring to FIG. 2, the semiconductor device having an external power voltage control function comprises an input circuit 210 for providing an output signal to a DPD detector and controller 220 in response to an input data signal Din; a DPD detector and controller 220 for detecting a DPD mode in response to the signal received from the input circuit 210, generating a control signal, and providing the generated control signal to internal power voltage generators 230a, 230b and 230c and an external power voltage controller 400; internal power voltage generators 230a, 230b and 230c for generating an internal power voltage level signal VINT or a ground voltage level VSS in response to the control signal received from the DPD detector and controller 220; and an internal circuit 240, which is driven by the internal power voltage VINT applied from the internal power voltage generators 230a, 230b and 230c. The semiconductor device further comprises: a level shifter 300 for shifting the internal power voltage level VINT output from the internal circuit 240 to an external power voltage level VDDQ; an external power voltage controller 400 for interrupting the external power voltage VDDQ applied to the level shifter 300 or a connection to the grounding terminal VSSQ in response to a DPD command signal PDPDE generated from the DPD detector and controller 220, and shifting the output of the level shifter 300 to a specific level VSSQ or VDDQ; and an output circuit 370 for providing output data Dout in response to the shifted output signal N of the level shifter 300.

Exemplary operations of the semiconductor device having an external power voltage control function of FIG. 2, according to some embodiments of the present invention, will now be described. In the DPD mode, the DPD detector and controller 220 generates a DPD command signal PDPDE, and the internal power voltage generators 230a, 230b and 230c are turned off by the DPD command signal PDPDE to output the grounding voltage level signal VSS. In addition, the external power voltage controller 400 interrupts an external power voltage VDDQ applied to the level shifter 300 or a connection to the grounding terminal VSSQ in response to the DPD command signal PDPDE, shifts the output of the level shifter 300 to a specific level VSSQ or VDDQ, and provides the shifted output of the level shifter 300 to the output circuit 370. Subsequently, the output circuit 370 provides high impedance data Dout to the data output in response to the shifted output N of the level shifter 300. The construction and operations of the external power voltage controller 400 will be described in detail hereinbelow.

In this manner, some embodiments of the present invention illustrated in FIG. 2 may interrupt the external power voltage applied to the circuitry in the DPD mode and shift the power voltage in the circuitry to a specific level VSSQ to reduce leakage current and an erroneous trigger of circuitry when an internal power voltage is turned on/off. In addition, some embodiments of the present invention interrupt the applied external power voltage VDDQ or a connection to the grounding terminal VSSQ in the DPD mode and shift the output of the circuitry to a specific level VSSQ or VDDQ to sustain the output of the driver in a high-impedance state, thereby reducing or minimizing the current consumption.

Figure 3:
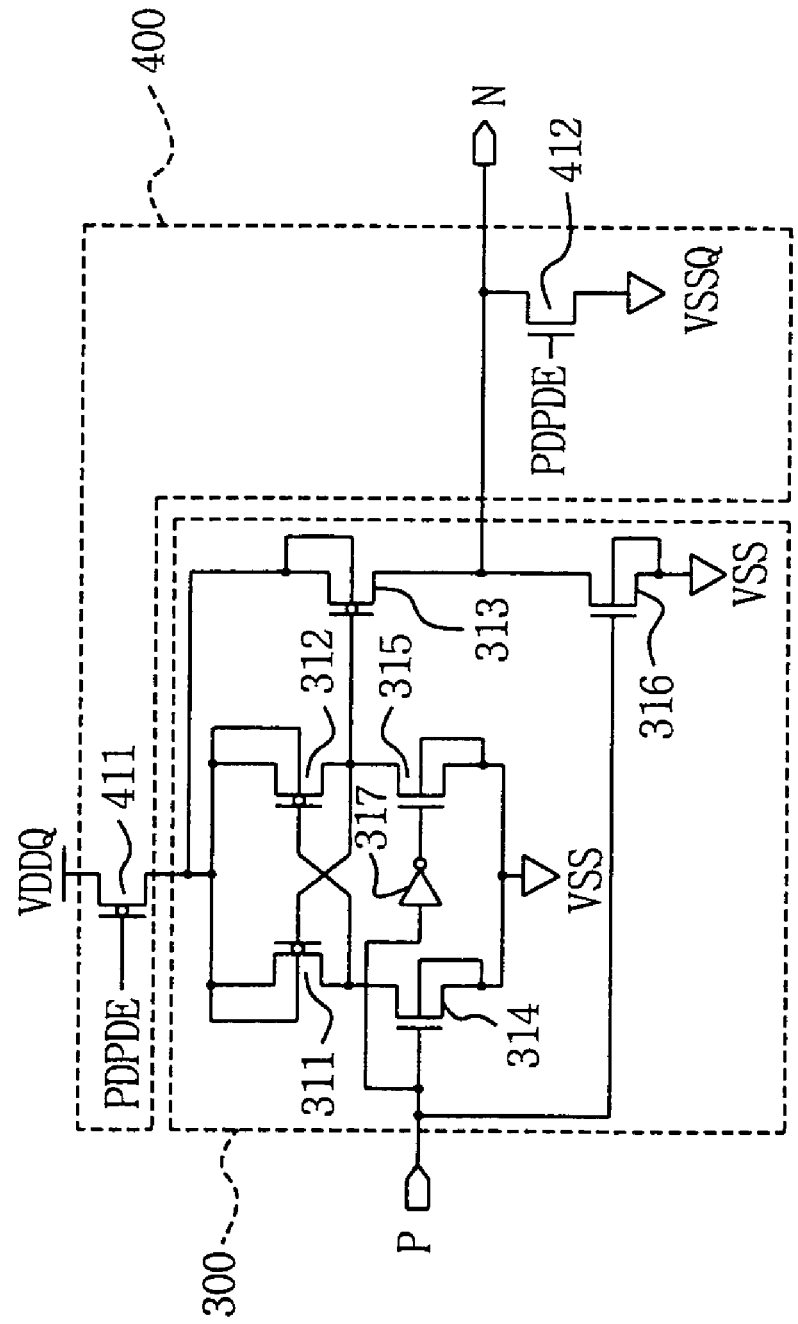
FIG. 3 is a circuit diagram of a semiconductor device having an external power voltage control function in accordance with further embodiments of the present invention.

FIG. 3 is a circuit diagram of a semiconductor device having an external power voltage control function according to further embodiments of the present invention. Referring to FIG. 3, the semiconductor device having an external power voltage control function according to some embodiments of the present invention includes a level shifter 300 to which an external power voltage is applied, and an external power voltage controller 400 for controlling the external power voltage in response to a DPD command signal generated in the DPD mode.

The level shifter 300, which comprises three PMOS transistors 311, 312 and 313, three NMOS transistors 314, 315 and 316, and one inverter 317, shifts an input signal of an internal power voltage level VINT to an external power voltage level VDDQ. The first, second, and third PMOS transistors 311, 312, and 313 have their sources connected in common to one another. The first PMOS transistor 311 has a gate connected in common to the drains of the second PMOS transistor 312 and the second NMOS transistor 315, and the gate of the third PMOS transistor 313. The second PMOS transistor 312 has a gate connected in common to the drains of the first PMOS transistor 311 and the first NMOS transistor 314. Therefore, the first and second PMOS transistors 311 and 312 are connected to each other with a cross-couple structure. The gate of the first NMOS transistor 314 is connected to an input signal P, and the gate of the second NMOS transistor 315 is connected to an inverted signal of the input signal P. The first and second NMOS transistors 314 and 315 have their sources connected to the ground VSS. The third NMOS transistor 316 has a drain connected to the drain of the third PMOS transistor 313, a gate connected to the input signal P, and a source connected to the ground VSS.

The external power voltage controller 400 comprises a power voltage interrupter for interrupting the external power voltage VDDQ applied to the level shifter 300, and a power voltage shifter for shifting the output of the level shifter 300 to a specific level. The power voltage interrupter may include at least one MOS transistor for performing a switching operation to interrupt the external power voltage applied to the level shifter 300 in response to the DPD command signal PDPDE. The power voltage shifter may include at least one MOS transistor for performing a switching operation to shift the output of the level shifter 300 to a specific level in response to the state of the DPD command signal PDPDE.

In some embodiments of the present invention, the power voltage interrupter comprises one PMOS transistor 411, and the power voltage shifter comprises one NMOS transistor 412. The PMOS transistor 411 has a drain connected in common to the sources of the first, second, and third PMOS transistors 311, 312, and 313, a gate connected to the DPD command signal PDPDE, and a source connected to the external power voltage VDDQ. The NMOS transistor 412 has a drain connected in common to the drains of the third PMOS transistor 313 and the third NMOS transistor 316, a gate connected to the DPD command signal PDPDE, and a source connected to the ground VSSQ.

Exemplary operations of the semiconductor device having an external power voltage control function shown in FIG. 3, according to some embodiments of the present invention, will now be described. In the DPD mode of a semiconductor memory, a supply of the internal power voltage VINT to the level shifter 300 is interrupted, and a DPD command signal PDPDE is generated. The generated DPD command signal PDPDE causes the PMOS transistor 411 to turn off to interrupt the external power voltage VDDQ applied to the level shifter 300. The DPD command signal PDPDE also causes the NMOS transistor 412 to turn on to shift the output of the level shifter 300 to a specific level, such as the grounding voltage level VSSQ, and to provide a shifted signal N. In exiting the DPD mode, the PMOS transistor 411 is turned on, the NMOS transistor 412 being turned off. Hence, the external power voltage VDDQ is applied to the level shifter 300 to put the level shifter 300 in a normal operation mode.

In this manner, some embodiments of the present invention illustrated in FIG. 3, which may be used for circuitry to which an external power voltage is applied, interrupt the external power voltage applied to the circuitry in the DPD mode and shifts the power voltage in the circuitry to a specific level to reduce or minimize the occurrence of leakage current and to prevent an erroneous trigger of the circuitry when an internal power voltage is turned on/off.

Figure 4:
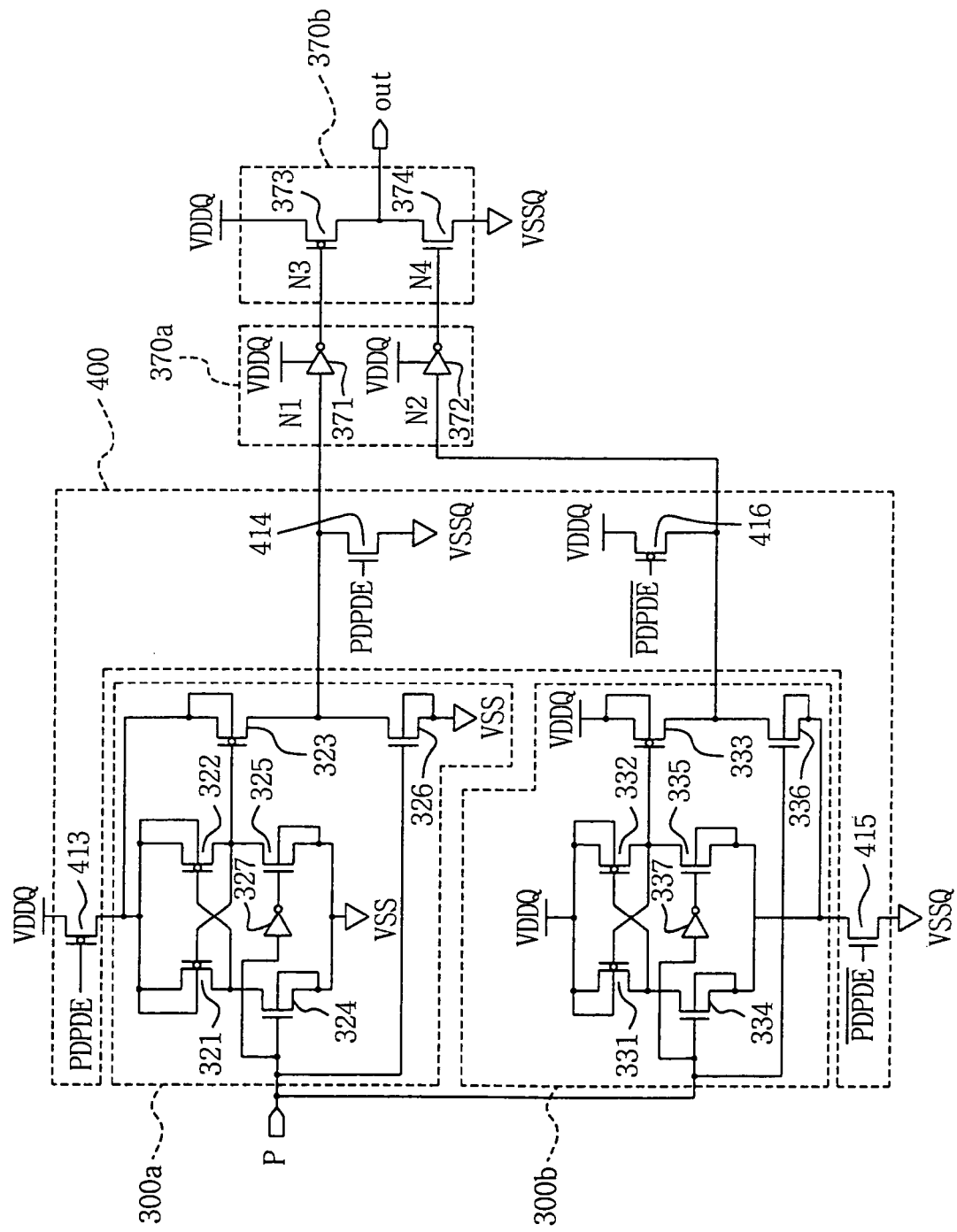
FIG. 4 is a circuit diagram of a semiconductor device having an external power voltage control function in accordance with further embodiments of the present invention.
Figure 5:
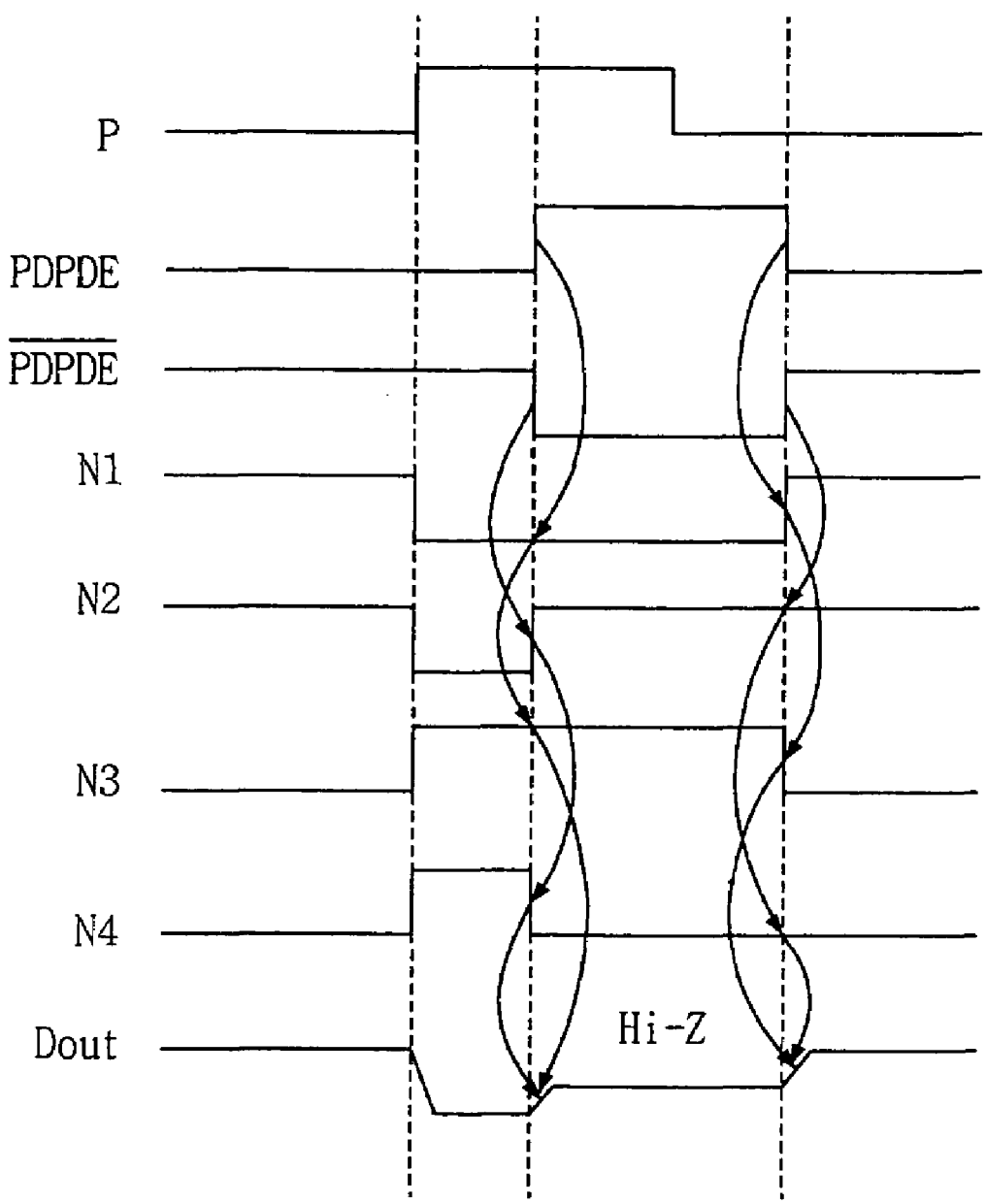
FIG. 5 is a timing diagram showing the applied signal and the operation of each node in the semiconductor device having the external power voltage control function of FIG. 4.

FIG. 4 is a circuit diagram of a semiconductor device having an external power voltage control function, according to further embodiments of the present invention, and FIG. 5 is a timing diagram showing the applied signal and the operation of each node in the semiconductor device having the external power voltage control function of FIG. 4.

Referring to FIG. 4, the semiconductor device having an external power voltage control function, according to further embodiments of the present invention, includes a level shifter 300 to which an external power voltage is applied, an external power voltage controller 400 for controlling the external power voltage in response to a DPD command signal generated in the DPD mode, an inverter 370a for inverting the output of the level shifter 300, and a driver 370b for providing output data Dout in response to the inverted signal.

The level shifter 300 comprises first and second level shifters 300a and 300b for shifting an input signal of the internal power voltage level VINT to the external power voltage level VDDQ. The first level shifter 300a comprises three PMOS transistors 321, 322 and 323, three NMOS transistors 324, 325 and 326, and one inverter 327. Likewise, the second level shifter 300b comprises three PMOS transistors 331, 332 and 333, three NMOS transistors 334, 335 and 336, and one inverter 337.

The first, second, and third PMOS transistors 321, 322 and 323 of the first level shifter 300a have their sources connected in common to one another. The first PMOS transistor 321 has a gate connected in common to the drains of the second PMOS transistor 322 and the second NMOS transistor 325, and the gate of the third PMOS transistor 323. The second PMOS transistor 322 has a gate connected in common to the drains of the first PMOS transistor 321 and the first NMOS transistor 324. Therefore, the first and second PMOS transistors 321 and 322 are connected to each other with a cross-couple structure. The gate of the first NMOS transistor 324 is connected to an input signal P, and the gate of the second NMOS transistor 325 is connected to an inverted signal of the input signal P. The first and second NMOS transistors 324 and 325 have their sources connected to the ground VSS. The third NMOS transistor 326 has a drain connected to the drain of the third PMOS transistor 323, a gate connected to the input signal P, and a source connected to the ground VSS.

The first, second, and third PMOS transistors 331, 332, and 333 of the second level shifter 300b have their sources connected in common to one another. The first PMOS transistor 331 has a gate connected in common to the drains of the second PMOS transistor 332 and the second NMOS transistor 335, and the gate of the third PMOS transistor 333. The second PMOS transistor 332 has a gate connected in common to the drains of the first PMOS transistor 331 and the first NMOS transistor 334. Therefore, the first and second PMOS transistors 331 and 332 are connected to each other with a cross-couple structure. The gate of the first NMOS transistor 334 is connected to the input signal P, and the gate of the second NMOS transistor 335 is connected to an inverted signal of the input signal P. The first, second, and third NMOS transistors 334, 335, and 336 have their sources connected in common to one another. The third NMOS transistor 336 has a gate connected to the input signal P, and a drain connected to the drain of the third PMOS transistor 323.

The external power voltage controller 400 comprises a first external power voltage controller for interrupting the external power voltage supplied to the first level shifter 300a in response to a DPD command signal and shifting the output N1 of the first level shifter to a first level, and a second external power voltage controller for interrupting a connection to the grounding terminal connected to the second level shifter 300b in response to the DPD command signal and shifting the output N2 of the second level shifter to a second level. The first level is the grounding voltage level VSSQ, and the second level is the external power voltage level VDDQ. The first external power voltage controller comprises at least one MOS transistor for performing a switching operation to interrupt the external power voltage supplied to the first level shifter in response to the DPD command signal, and at least one MOS transistor for performing a switching operation to shift the output of the first level shifter to the first level. Likewise, the second external power voltage controller comprises at least one MOS transistor for performing a switching operation to interrupt a connection to the grounding terminal connected to the second level shifter in response to the DPD command signal, and at least one MOS transistor for performing a switching operation to shift the output of the second level shifter to the second level.

According to some embodiments of the present invention, the first external power voltage controller comprises one PMOS transistor 413 and one NMOS transistor 414, and the second external power voltage controller comprises one NMOS transistor 415 and one PMOS transistor 416. The PMOS transistor 413 of the first external power voltage controller has a drain connected in common to the sources of the first, second, and third PMOS transistors 321, 322, and 323 of the first level shifter, a gate connected to the DPD command signal PDPDE, and a source connected to the external power voltage VDDQ. The NMOS transistor 414 of the first external power voltage controller has a drain connected in common to the drains of the third PMOS transistor 323 and the third NMOS transistor 326 of the first level shifter, a gate connected to the DPD command signal PDPDE, and a source connected to the grounding terminal VSSQ. The NMOS transistor 415 of the second external power voltage controller has a drain connected in common to the sources of the first, second, and third NMOS transistors 334, 335, and 336 of the first level shifter, a gate connected to an inverted signal of the DPD command signal PDPDE, and a source connected to the grounding terminal VSSQ. The PMOS transistor 416 of the second external power voltage controller has a drain connected in common to the drains of the third PMOS transistor 333 and the third NMOS transistor 336 of the second level shifter, a gate connected to an inverted signal of the DPD command signal PDPDE, and a source connected to the external power voltage VDDQ.

The first external power voltage controller, if constructed to respond to the inverted signal of the DPD command signal PDPDE, may use an NMOS transistor instead of the PMOS transistor 413, and a PMOS transistor instead of the NMOS transistor 414. Likewise, the second external power voltage controller, if constructed to respond to the DPD command signal PDPDE, may use a PMOS transistor instead of the NMOS transistor 415, and an NMOS transistor instead of the PMOS transistor 416.

The inverter 370a comprises first and second inverters 371 and 372 for inverting the shifted outputs of the level shifter. The first and second inverters 371 and 372 are driven by the external power voltage VDDQ. The first inverter 371 inverts the shifted signal of the first level, and the second inverter 372 inverts the shifted signal of the second level.

The driver 370b comprises one pull-up transistor 374 and one pull-down transistor 375, and provides output data Dout in response to the inverted signal from the inverter 370a. The pull-up transistor 374 comprises a PMOS transistor, and the pull-down transistor 375 comprises an NMOS transistor.

FIG. 5 shows the applied signal and the operational timing of each node in the semiconductor device of FIG. 4. When an input signal P is "H" in a non-DPD mode, the outputs N1 and N2 of the first and second level shifters are "L". The outputs of "L" are inverted into "H" by the inverter 370a and applied to the driver 370b to turn the pull-up transistor 373 off and the pull-down transistor 374 on and output data of level "L".

In the DPD mode, a supply of the internal power voltage VINT to the level shifter 300 is interrupted, and a DPD command signal PDPDE is generated. With the DPD command signal applied in the "H" state, the PMOS transistor 413 of the first external power voltage controller is turned off to interrupt the external power voltage VDDQ applied to the first level shifter 300a, and the NMOS transistor 414 is turned on to shift the output N1 of the first level shifter to the first level, i.e., "L". With the DPD command signal inverted to "L", the NMOS transistor 415 of the second external power voltage controller is turned off to interrupt a connection to the grounding terminal connected to the second level shifter 300b, and the PMOS transistor 416 is turned on to shift the output N2 of the second level shifter to "H". The output signal N1 of the first level shifter is inverted to a signal N3 of level "H" by the first inverter, and the output signal N2 of the second level shifter is inverted to a signal N4 of level "L" by the second inverter. The inverted output signals N3 and N4 are applied to the driver 370b to turn the pull-up and pull-down transistors off. Accordingly, the output Dout of the driver is sustained at the high-impedance state in the DPD mode.

In exiting the DPD mode, the DPD command signal PDPDE is applied in the "L" state, turning the PMOS transistor 413 of the first external power voltage controller on and the NMOS transistor 414 off and applying the external power voltage VDDQ to the first level shifter 300a to put the first level shifter 300a in a normal operation mode. Also, the inverted signal "H" of the DPD command signal PDPDE is applied to turn the NMOS transistor 415 of the second external power voltage controller on and the PMOS transistor 416 off, thereby connecting the second level shifter 300b to the grounding terminal to put the second level shifter 300b in a normal operation mode.

In this manner, some embodiments of the present invention illustrated in FIGS. 4 and 5, which may be used for circuitry to which an external power voltage is applied, interrupt the external power voltage applied to the circuitry in the DPD mode and shifts the power voltage in the circuitry to a specific level VSSQ to reduce and/or prevent the occurrence of leakage current and an erroneous trigger of the circuitry when an internal power voltage is turned on/off. In addition, some embodiments of the present invention interrupt the applied external power voltage VDDQ or a connection to the grounding terminal VSSQ in the DPD mode and shift the output of the circuitry to a specific level (VSSQ or VDDQ) to sustain the output of the driver in a high-impedance state and to thereby reduce or minimize current consumption.

Figure 6:
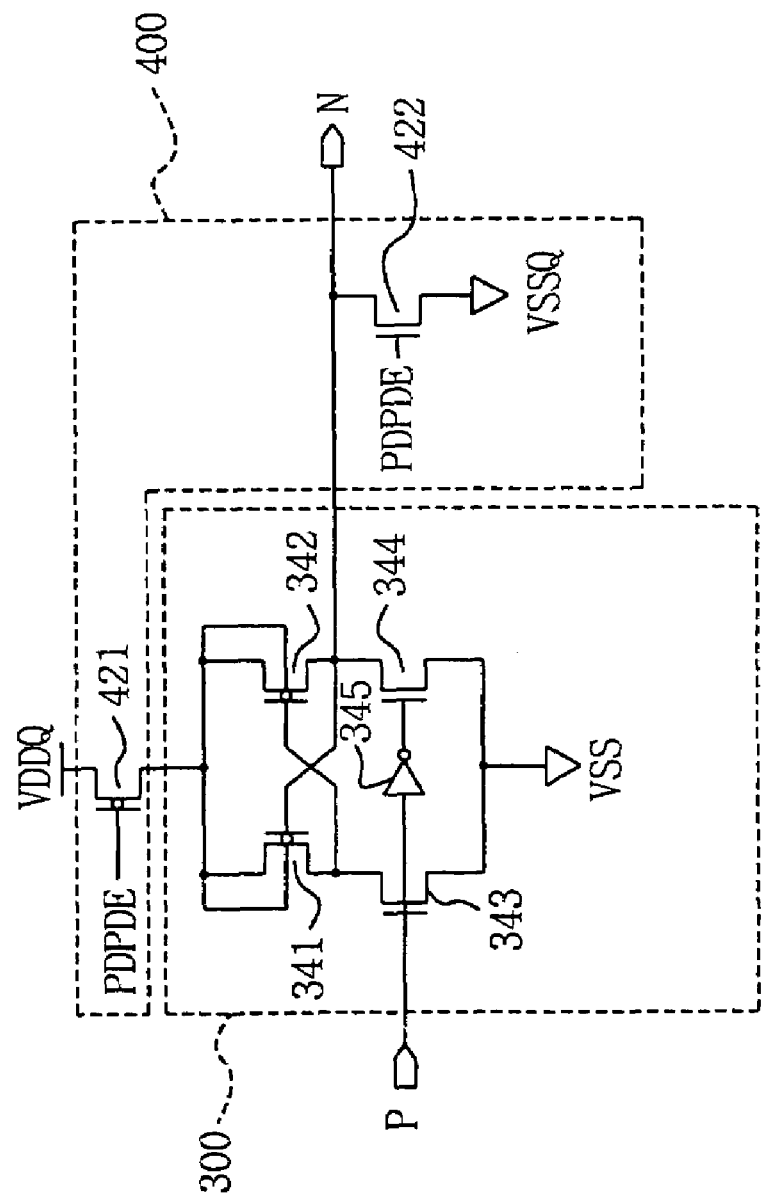
FIG. 6 is a circuit diagram of a semiconductor device having an external power voltage control function in accordance with further embodiments of the present invention.

FIG. 6 is a circuit diagram of a semiconductor device having an external power voltage control function according to further embodiments of the present invention. Referring to FIG. 6, the semiconductor device having an external power voltage control function, according to further embodiments of the present invention, comprises a level shifter 300 to which an external power voltage is applied, and an external power voltage controller 400 for controlling the external power voltage in response to a DPD command signal generated in the DPD mode.

The level shifter 300, which comprises two PMOS transistors 341 and 342, two NMOS transistors 343 and 344, and one inverter 345, shifts an input signal of an internal power voltage level VINT to an external power voltage level VDDQ. The first and second PMOS transistors 341 and 342 have their sources connected in common to each other. The first PMOS transistor 341 has a gate connected in common to the drains of the second PMOS transistor 342 and the second NMOS transistor 344. The second PMOS transistor 342 has a gate connected in common to the drains of the first PMOS transistor 341 and the first NMOS transistor 343. Therefore, the first and second PMOS transistors 341 and 342 are connected to each other with a cross-couple structure. The gate of the first NMOS transistor 343 is connected to an input signal P, and the gate of the second NMOS transistor 344 is connected to an inverted signal of the input signal P. The first and second NMOS transistors 343 and 344 have their sources connected to the ground VSS.

The external power voltage controller 400 comprises a power voltage interrupter for interrupting the external power voltage VDDQ applied to the level shifter 300, and a power voltage shifter for shifting the output of the level shifter 300 to a specific level. The power voltage interrupter may include at least one MOS transistor for performing a switching operation to interrupt the external power voltage applied to the level shifter 300 in response to the state of the DPD command signal PDPDE. The power voltage shifter may include at least one MOS transistor for performing a switching operation to shift the output of the level shifter 300 to a specific level in response to the state of the DPD command signal PDPDE.

In some embodiments of the present invention, the power voltage interrupter comprises one PMOS transistor 421, and the power voltage shifter comprises one NMOS transistor 422. The PMOS transistor 421 has a drain connected in common to the sources of the first and second PMOS transistors 341 and 342, a gate connected to the DPD command signal PDPDE, and a source connected to the external power voltage VDDQ. The NMOS transistor 422 has a drain connected in common to the drains of the second PMOS transistor 342 and the third NMOS transistor 344, a gate connected to the DPD command signal PDPDE, and a source connected to the ground VSSQ.

Operations of the semiconductor device having an external power voltage control function, according to some embodiments of the present invention illustrated in FIG. 6, will now be described. In the DPD mode of a semiconductor memory, a supply of the internal power voltage VINT to the level shifter 300 is interrupted, and a DPD command signal PDPDE is generated. The generated DPD command signal PDPDE causes the PMOS transistor to turn off to interrupt the external power voltage VDDQ applied to the level shifter 300. The DPD command signal PDPDE also causes the NMOS transistor 412 to turn on to shift the output of the level shifter 300 to a specific level, such as the grounding voltage level VSSQ, and to provide a shifted signal N. In exiting the DPD mode, the PMOS transistor 421 is turned on and the NMOS transistor 422 is turned off. Hence, the external power voltage VDDQ is applied to the level shifter 300 to put the level shifter 300 in a normal operation mode.

According to some embodiments of the present invention illustrated in FIG. 6, which may be used for circuitry to which an external power voltage is applied, leakage current in the circuitry may be reduced or minimized and an erroneous trigger of the circuitry may be prevented.

Figure 7:
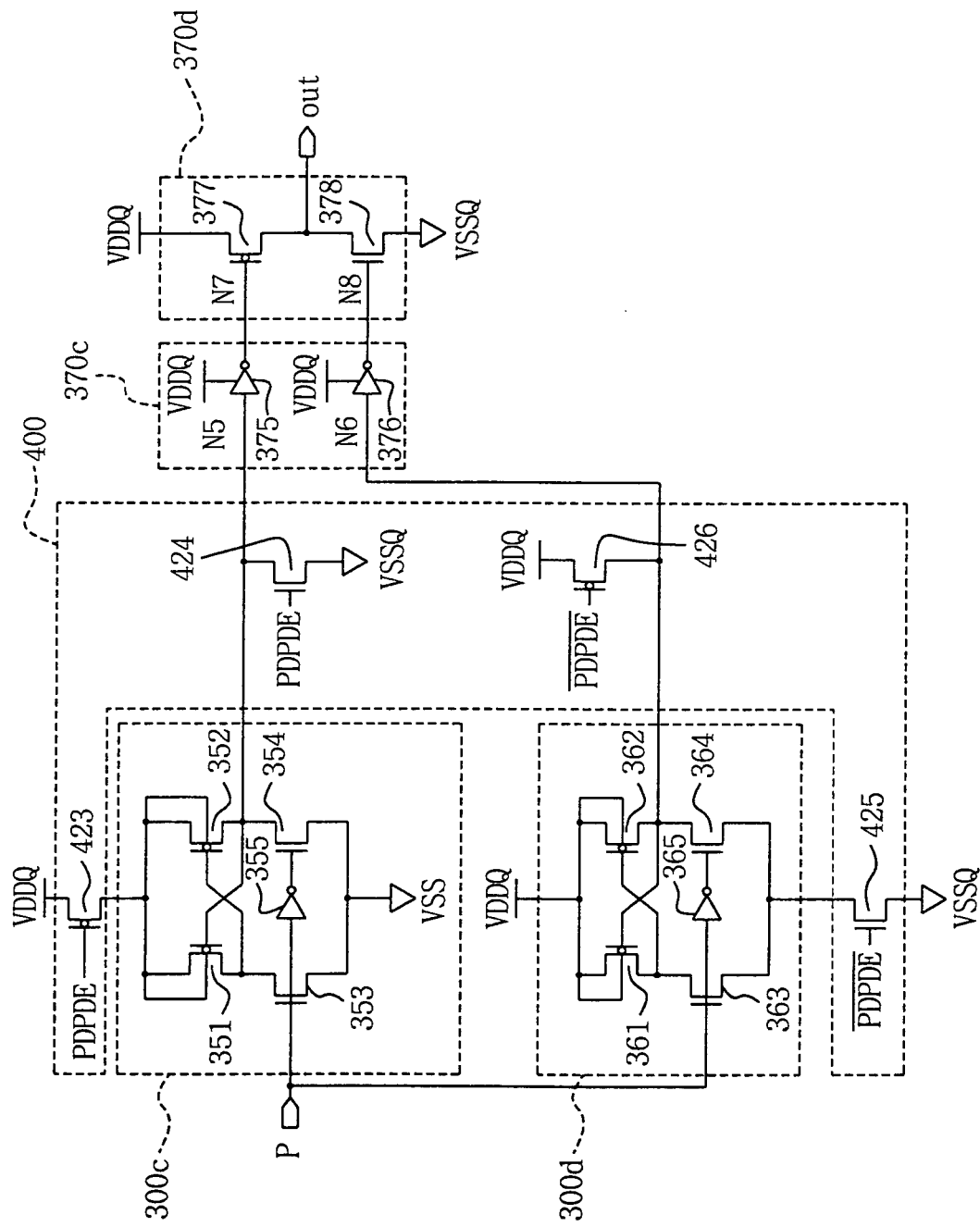
FIG. 7 is a circuit diagram of a semiconductor device having an external power voltage control function in accordance with further embodiments of the present invention.
Figure 8:
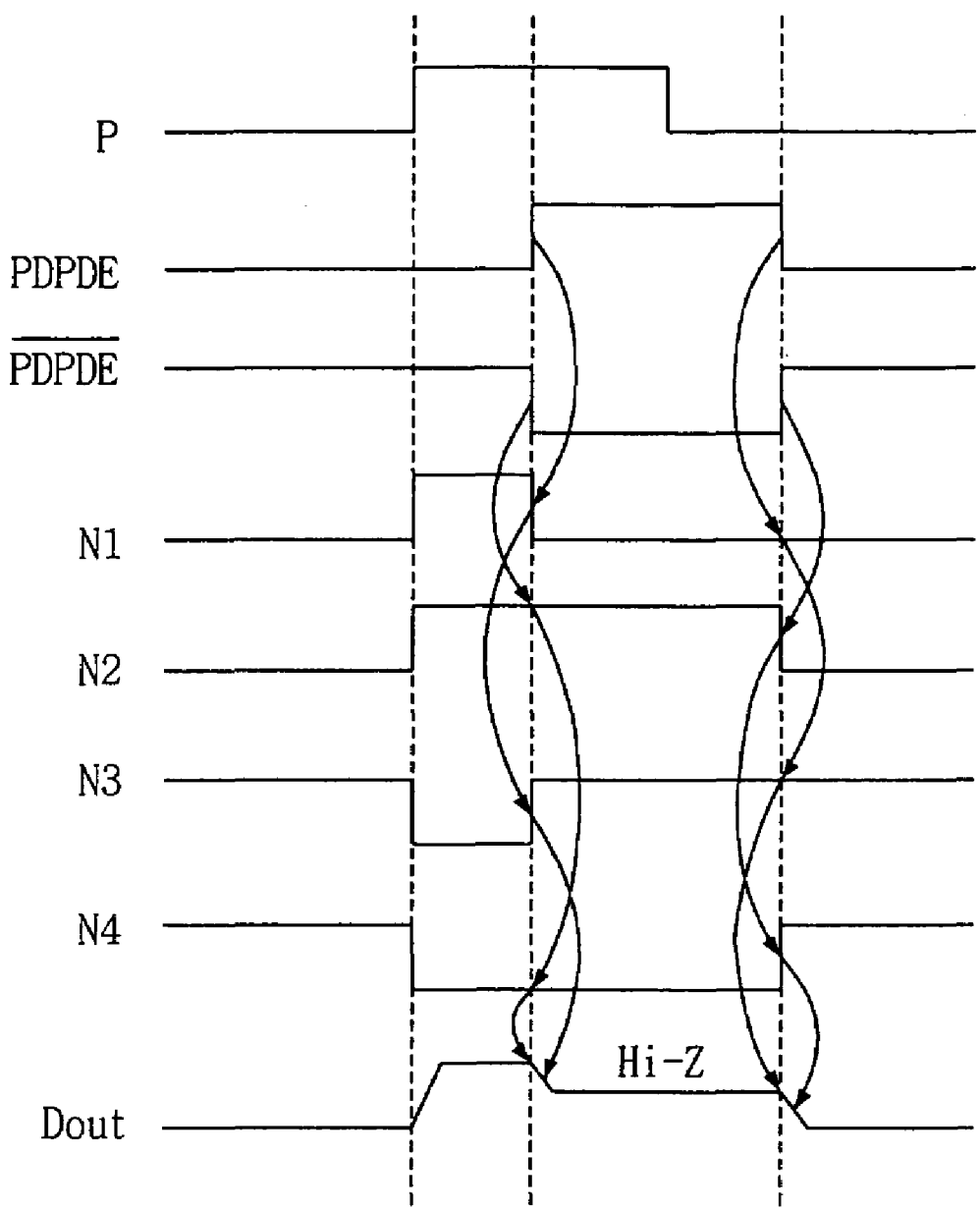
FIG. 8 is a timing diagram showing the applied signal and the operation of each node in the semiconductor device having the external power voltage control function of FIG. 7.

FIG. 7 is a circuit diagram of a semiconductor device having an external power voltage control function according to further embodiments of the present invention, and FIG. 8 is a timing diagram showing the applied signal and the operation of each node in the semiconductor device having the external power voltage control function of FIG. 7.

Referring to FIG. 7, the semiconductor device having an external power voltage control function, according to further embodiments of the present invention, includes a level shifter 300 to which an external power voltage is applied, an external power voltage controller 400 for controlling the external power voltage in response to a DPD command signal generated in the DPD mode, an inverter 370c for inverting the output of the level shifter 300, and a driver 370d for providing output data Dout in response to the inverted signal.

The level shifter 300 comprises first and second level shifters 300c and 300d for shifting an input signal of the internal power voltage level VINT to the external power voltage level VDDQ. The first level shifter 300c comprises two PMOS transistors 351 and 352, two NMOS transistors 353 and 354, and one inverter 355. Likewise, the second level shifter 300d comprises two PMOS transistors 361 and 362, two NMOS transistors 363 and 364, and one inverter 365.

The first and second PMOS transistors 351 and 352 of the first level shifter 300c have their sources connected in common to each other. The first PMOS transistor 351 has a gate connected in common to the drains of the second PMOS transistor 352 and the second NMOS transistor 324. The second PMOS transistor 352 has a gate connected in common to the drains of the first PMOS transistor 351 and the first NMOS transistor 353. Therefore, the first and second PMOS transistors 351 and 352 are connected to each other with a cross-couple structure. The gate of the first NMOS transistor 353 is connected to an input signal P, and the gate of the second NMOS transistor 354 is connected to an inverted signal of the input signal P. The first and second NMOS transistors 353 and 354 have their sources connected to the ground VSS.

The first and second PMOS transistors 361 and 362 of the second level shifter 300d have their sources connected in common to each other. The first PMOS transistor 361 has a gate connected in common to the drains of the second PMOS transistor 362 and the second NMOS transistor 364. The second PMOS transistor 362 has a gate connected in common to the drains of the first PMOS transistor 361 and the first NMOS transistor 363. Therefore, the first and second PMOS transistors 361 and 362 are connected to each other with a cross-couple structure. The gate of the first NMOS transistor 363 is connected to an input signal P, and the gate of the second NMOS transistor 335 is connected to an inverted signal of the input signal P. The first and second NMOS transistors 363 and 364 have their sources connected to the ground VSS.

The external power voltage controller 400 comprises a first external power voltage controller for interrupting the external power voltage supplied to the first level shifter 300c in response to a DPD command signal and shifting the output N1 of the first level shifter to a first level, and a second external power voltage controller for interrupting a connection to the grounding terminal connected to the second level shifter 300d in response to the DPD command signal and shifting the output N2 of the second level shifter to a second level. The first level is the grounding voltage level VSSQ, and the second level is the external power voltage level VDDQ. The first external power voltage controller comprises at least one MOS transistor for performing a switching operation to interrupt the external power voltage supplied to the first level shifter 300c in response to the DPD command signal, and at least one MOS transistor for performing a switching operation to shift the output N1 of the first level shifter to the first level. Likewise, the second external power voltage controller comprises at least one MOS transistor for performing a switching operation to interrupt a connection to the grounding terminal connected to the second level shifter 300d in response to the DPD command signal, and at least one MOS transistor for performing a switching operation to shift the output N2 of the second level shifter to the second level.

The first external power voltage controller comprises one PMOS transistor 423 and one NMOS transistor 424, the second external power voltage controller comprises one NMOS transistor 425 and one PMOS transistor 426. The PMOS transistor 423 of the first external power voltage controller has a drain connected in common to the sources of the first and second PMOS transistors 351 and 352 of the first level shifter, a gate connected to the DPD command signal PDPDE, and a source connected to the external power voltage VDDQ. The NMOS transistor 424 of the first external power voltage controller has a drain connected in common to the drains of the second PMOS transistor 352 and the second NMOS transistor 354 of the first level shifter, a gate connected to the DPD command signal PDPDE, and a source connected to the grounding terminal VSSQ. The NMOS transistor 425 of the second external power voltage controller has a drain connected in common to the sources of the first and second NMOS transistors 363 and 364 of the second level shifter, a gate connected to an inverted signal of the DPD command signal PDPDE, and a source connected to the grounding terminal VSSQ. The PMOS transistor 426 of the second external power voltage controller has a drain connected in common to the drains of the second PMOS transistor 362 and the second NMOS transistor 364 of the second level shifter, a gate connected to an inverted signal of the DPD command signal PDPDE, and a source connected to the external power voltage VDDQ.

The first external power voltage controller, if constructed to respond to the inverted signal of the DPD command signal PDPDE, may use an NMOS transistor instead of the PMOS transistor 423, and a PMOS transistor instead of the NMOS transistor 424. Likewise, the second external power voltage controller, if constructed to respond to the DPD command signal PDPDE, may use a PMOS transistor instead of the NMOS transistor 425, and an NMOS transistor instead of the PMOS transistor 426.

The inverter 370c comprises first and second inverters 375 and 376 for inverting the shifted outputs of the level shifter. The first and second inverters 375 and 376 are driven by the external power voltage VDDQ. The first inverter 375 inverts the shifted signal of the first level, and the second inverter 376 inverts the shifted signal of the second level.

The driver 370d comprises one pull-up transistor 377 and one pull-down transistor 378, and provides output data Dout in response to the inverted signal from the inverter 370c. The pull-up transistor 377 comprises a PMOS transistor, and the pull-down transistor 378 comprises an NMOS transistor.

FIG. 8 illustrates the applied signal and the operational timing of each node in the semiconductor device of FIG. 7. Referring to FIG. 8, when an input signal P is "H" in a non-DPD mode, the outputs N1 and N2 of the first and second level shifters are "L". The "L" outputs are inverted into "H" by the inverter 370c and applied to the driver 370d to turn the pull-up transistor 377 off and the pull-down transistor 378 on and output data of level "L".

In the DPD mode, a supply of the internal power voltage VINT to the level shifter 300 is interrupted, and a DPD command signal PDPDE is generated. With the DPD command signal applied in the "H" state, the PMOS transistor 423 of the first external power voltage controller is turned off to interrupt the external power voltage VDDQ applied to the first level shifter 300c, and the NMOS transistor 424 is turned on to shift the output N1 of the first level shifter to the first level, i.e., "L". With the DPD command signal inverted to "L", the NMOS transistor 425 of the second external power voltage controller is turned off to interrupt a connection to the grounding terminal connected to the second level shifter 300d, and the PMOS transistor 426 is turned on to shift the output N2 of the second level shifter to "H". The output signal N1 of the first level shifter is inverted to a signal N3 at level "H" by the first inverter, and the output signal N2 of the second level shifter is inverted to a signal N4 at level "L" by the second inverter. The inverted output signals N3 and N4 are applied to the driver 370d to turn the pull-up and pull-down transistors 373 and 374 off. Accordingly, the output Dout of the driver is sustained at the high-impedance state in the DPD mode.

In exiting the DPD mode, the DPD command signal PDPDE is applied in the "L" state, turning the PMOS transistor 423 of the first external power voltage controller on and the NMOS transistor 424 off and applying the external power voltage VDDQ to the first level shifter 300c to put the first level shifter 300c in a normal operation mode. Also, the inverted signal "H" of the DPD command signal PDPDE is applied to turn the NMOS transistor 425 of the second external power voltage controller on and the PMOS transistor 426 off, thereby connecting the second level shifter 300d to the grounding terminal to put the second level shifter 300d in a normal operation mode.

In this manner, the embodiments of present invention illustrated in FIG. 7, which may be used for circuitry to which an external power voltage is applied, reduces or minimizes the occurrence of leakage current in the circuitry, prevents an erroneous trigger of circuitry, and sustains the output of the driver in a high-impedance state, thereby reducing or minimizing current consumption.

Figure 9:
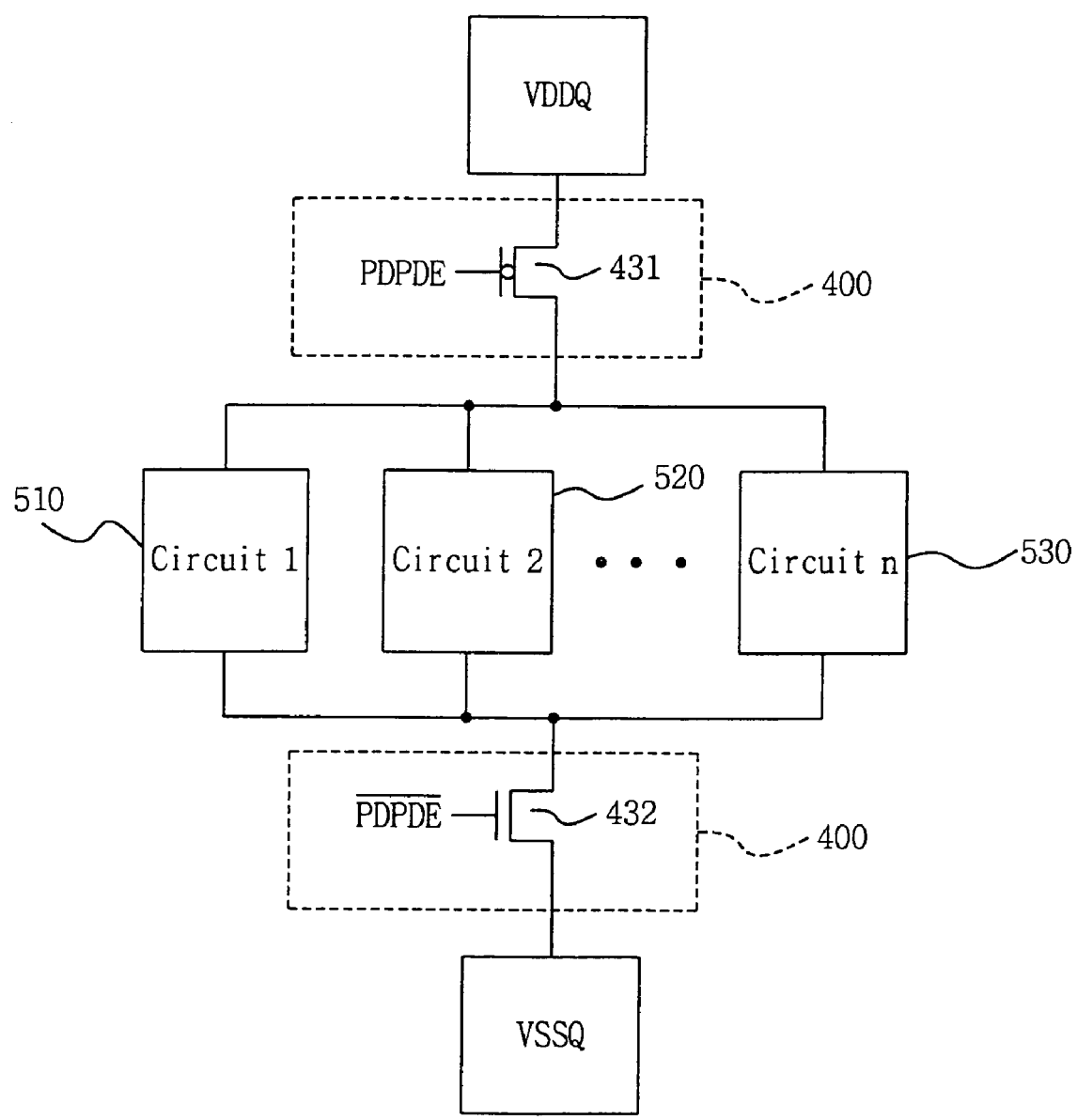
FIG. 9 is a block diagram of a semiconductor device having an external power voltage control function according to further embodiments of the present invention.

FIG. 9 is a block diagram of a semiconductor device having an external power voltage control function according to further embodiments of the present invention. Referring to FIG. 9, the semiconductor device having an external power voltage control function comprises circuits 510, 520, and 530 to which an external power voltage is applied with an interrupted supply of an internal power voltage in the DPD mode of a semiconductor memory; and an external power voltage controller 400 for interrupting the external power voltage in response to the state of a DPD command signal generated in the DPD mode. The external power voltage controller 400 comprises at least one MOS transistor for performing a switching operation to interrupt the external power voltage applied to the circuits in response to the DPD command signal, and at least one MOS transistor for performing a switching operation to interrupt a connection to the grounding terminal connected to the circuits in response to the DPD command signal.

The external power voltage controller comprises one PMOS transistor 431 and one NMOS transistor 432. The PMOS transistor 431 has a drain connected in common to the circuits 510, 520, and 530, a gate connected to the DPD command signal PDPDE, and a source connected to the external power voltage VDDQ. The NMOS transistor 432 has a drain connected in common to the drains of the circuits 510, 520, and 530, a gate connected to the inverted signal of the DPD command signal PDPDE, and a source connected to the ground VSSQ.

If an NMOS transistor is used instead of the PMOS transistor 431, the gate of the NMOS transistor is connected to the inverted signal of the DPD command signal PDPDE. If a PMOS transistor is used instead of the NMOS transistor 432, the gate of the PMOS transistor is connected to the DPD command signal PDPDE.

Exemplary operations of the semiconductor device having an external power voltage control function according to the embodiments of FIG. 9 will now be described. In the DPD mode of a semiconductor memory, a supply of the internal power voltage VINT to the circuits 510, 520, and 530 is interrupted, and a DPD command signal PDPDE is generated. The generated DPD command signal PDPDE causes the PMOS transistor 431 to turn off to interrupt the external power voltage VDDQ applied to the circuits 510, 520, and 530. The inverted signal of the DPD command signal PDPDE causes the NMOS transistor 432 to turn off to interrupt a connection of the grounding terminal connected to the circuits 510, 520, and 530. In exiting the DPD mode, the PMOS transistor 431 is turned on and the NMOS transistor 432 is turned off. Hence, the external power voltage VDDQ is applied to the circuits 510, 520, and 530 and a connection to the grounding terminal is established to put the circuits 510, 520, and 530 in a normal operation mode.

In this manner, the embodiments of the present invention illustrated in FIG. 9, which may be used for circuits to which an external power voltage is applied, interrupts the external power voltage connected to the circuits in the DPD mode to reduce or minimize the occurrence of leakage current and to prevent an erroneous trigger of the circuits when an internal power voltage is turned on/off.

As described above, embodiments of the present invention, which may be used for circuitry to which an external power voltage is applied, interrupts the external power voltage applied to the circuitry in the DPD mode and shifts the power voltage in the circuitry to a specific level to reduce or prevent leakage current in the circuitry. Moreover, embodiments of the present invention may shift unspecified power voltages in the circuitry to a specific level in the DPD mode to reduce the likelihood of an erroneous trigger of circuitry when the internal power voltage generators are turned on/off. Embodiments of the present invention may be applicable to all the circuitry of a semiconductor memory device to which an external power voltage is applied in the DPD mode.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A semiconductor device, comprising:
    a memory;
    a level shifter comprising first and second level shifters that are configured to shift an internal power voltage level to an external power voltage level;
    an external power voltage controller comprising a first external power voltage controller configured to interrupt an external power voltage applied to the first level shifter responsive to a Deep Power Down (DPD) command signal generated in a DPD mode of a memory and to shift an output of the first level shifter to a first level, and a second external power voltage controller configured to interrupt a connection to a ground terminal connected to the second level shifter responsive to the DPD command signal and to shift an output of the second level shifter to a second level;
    an inverter configured to invert the shifted outputs of the first and second level shifters; and
    a driver for outputting high-impedance data responsive to the inverted shifted output signals of the first and second level shifters.

2. The semiconductor device as claimed in claim 1, wherein the first and second level shifters are responsive to the external power voltage.

3. The semiconductor device as claimed in claim 1, wherein the first external power voltage controller comprises:
    at least one MOS transistor configured to perform a switching operation to interrupt the external power voltage applied to the first level shifter responsive to the DPD command signal; and
    at least one MOS transistor configured to perform a switching operation to shift the output of the first level shifter to the first level.

4. The semiconductor device as claimed in claim 1, wherein the second external power voltage controller comprises;
    at least one MOS transistor configured to perform a switching operation to interrupt a connection to the ground terminal connected to the second level shifter responsive to the DPD command signal; and
    at least one MOS transistor configured to perform a switching operation to shift the output of the second level shifter to the second level.

5. The semiconductor device as claimed in claim 1, wherein the first level comprises a ground voltage level.

6. The semiconductor device as claimed in claim 1, wherein the second level comprises an external power voltage level.

7. The semiconductor device as claimed in claim 1, wherein the inverter comprises:
    a first inverter configured to invert the shifted output of the first level shifter; and
    a second inverter configured to invert the shifted output of the second level shifter.

8. The semiconductor device as claimed in claim 1, wherein the driver comprises one pull-up transistor and one pull-down transistor.

9. The semiconductor device as claimed in claim 8, wherein the pull-up transistor is responsive to the shifted output of the first level shifter, the pull-down transistor being responsive to the shifted output of the second level shifter.

10. A method of operating a semiconductor device comprising a memory, the method comprising:
  interrupting an external power voltage applied to circuitry of the semiconductor device responsive to a Deep Power Down (DPD) command signal generated in a DPD mode of the memory;
  shifting a first output of the circuitry to a first level;
  interrupting a connection to a ground terminal connected to the circuitry responsive to the DPD command signal;
  shifting a second output of the circuitry to a second level;
  inverting the shifted signals of the first and second levels; and
  outputting high-impedance data responsive to the inverted signals of the first and second levels.

11. The external power voltage control method as claimed in claim 10, wherein the first level comprises a ground voltage level.

12. The external power voltage control method as claimed in claim 10, wherein the second level comprises an external power voltage level.

* * * * *